(12) United States Patent
Gavrilov et al.

(10) Patent No.: US 10,797,515 B2
(45) Date of Patent: Oct. 6, 2020

(54) METHOD FOR CONTROLLING AN UNINTERRUPTIBLE POWER SUPPLY AND SYSTEM FOR AN UNINTERRUPTIBLE POWER SUPPLY (71) Applicant: Maschinenfabrik Reinhausen GmbH, Regensburg (DE)

(72) Inventors: Andrey Gavrilov, Regensburg (DE); Manfried Kruska, Herzogenaurach (DE); Alexander Reich, Mintraching (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 60 days.

(21) Appl. No.: 16/328,729

(22) PCT Filed: Aug. 25, 2017

(86) PCT No.: PCT/EP2017/071463
§ 371 (c)(1),
(2) Date: Feb. 27, 2019

(87) PCT Pub. No.: WO2018/041742
PCT Pub. Date: Mar. 8, 2018

(65) Prior Publication Data
US 2019/0199127 A1    Jun. 27, 2019

(30) Foreign Application Priority Data
Sep. 1, 2016 (EP) .................................... 16186872

(51) Int. Cl.
*H02J 9/06* (2006.01)
*H01L 29/744* (2006.01)
*H03K 17/79* (2006.01)

(52) U.S. Cl.
CPC ............ *H02J 9/062* (2013.01); *H01L 29/744* (2013.01); *H03K 17/79* (2013.01); *H02J 9/068* (2020.01)

(58) Field of Classification Search
CPC .......... H02J 9/068; H02J 9/062; H01L 29/744; H03K 17/79
See application file for complete search history.

(56) References Cited

U.S. PATENT DOCUMENTS 4,782,241 A * 11/1988 Baker ..................... H02J 9/062
307/66
5,210,685 A * 5/1993 Rosa ........................ H02J 9/062
307/64
(Continued)

FOREIGN PATENT DOCUMENTS

EP      1160965 B1    8/2004
EP      1276202 B1    1/2008
(Continued)

*Primary Examiner* — Jared Fureman
*Assistant Examiner* — Duc M Pham
(74) *Attorney, Agent, or Firm* — Leydig, Voit & Mayer, Ltd.

(57) ABSTRACT

A method controls an UPS with a system having: first and second terminals, a switch having: first and second switch terminals respectively connected to the first and second terminals; first and second thyristors connected between the first and second switch terminals in anti-parallel; and an inverter connected to the second terminal and the energy store. Switch current and a first potential at the first terminal are detected. In a first fault, where the first potential drops past a first rule and the switch current rises above a second rule: a second potential at the second switch terminal is set using the inverter so the switch current becomes zero. Then the switch current is compared with a second threshold, and if it is exceeded, a first check result is positive, otherwise it's negative. When positive, the second potential is reversed.

15 Claims, 4 Drawing Sheets (56) References Cited

U.S. PATENT DOCUMENTS

| | | |
|---|---|---|
| 2002/0036911 A1 | 3/2002 | Okui |
| 2006/0202636 A1* | 9/2006 | Schneider ............... H02J 9/062 |
| | | 315/291 |
| 2014/0097690 A1 | 4/2014 | Bonora et al. |
| 2018/0152046 A1* | 5/2018 | Toyoda ................... H02J 9/062 |
| 2018/0191194 A1* | 7/2018 | Nakano ............... H02M 7/5387 |
| 2019/0044377 A1* | 2/2019 | Toyoda ................... H02J 9/062 |

FOREIGN PATENT DOCUMENTS

| | | |
|---|---|---|
| JP | H08103036 A | 4/1996 |
| JP | 2003259567 A | 9/2003 |

* cited by examiner

METHOD FOR CONTROLLING AN UNINTERRUPTIBLE POWER SUPPLY AND SYSTEM FOR AN UNINTERRUPTIBLE POWER SUPPLY

CROSS-REFERENCE TO PRIOR APPLICATIONS

This application is a U.S. National Stage Application under 35 U.S.C. § 371 of International Application No. PCT/EP2017/071463 filed on Aug. 25, 2017, and claims benefit to European Patent Application No. EP 16186872.4 filed on Sep. 1, 2016. The International Application was published in German on Mar. 8, 2018, as WO 2018/041742 A1 under PCT Article 21(2).

FIELD

The invention relates to a method of controlling an uninterrupted power supply and to a system for uninterrupted power supply.

BACKGROUND

Thyristors are well-known semiconductors which in power electronics are designed for switching high electrical currents and voltages. The following terms are usually used in connection with a thyristor:
 'main voltage' is the voltage between its anode and its cathode;
 'main current' is the current through the cathode;
 'control voltage' is the voltage between its gate and the cathode, the voltage being positive when the gate has the higher potential by comparison with the cathode;
 'control current' is the current through the gate;
 'trigger current' is a control current flowing into the gate, the control current then being positive;
 'extinguishing current' is a control current flowing out of the gate, the control current then being negative;
 'forward direction' is the direction from anode to cathode;
 'forward voltage' is the main voltage poled in forward direction, the main voltage then being positive;
 'forward current' is the main current flowing in forward direction, the main current then being positive;
 'reverse direction' is the direction from cathode to anode;
 'reverse voltage' is the main voltage poled in reverse direction, the main voltage then being negative;
 'reverse current' is the main current flowing in reverse direction, the main current then being negative;
 'blocking state' and 'conducting state' are the two stable operating states which the thyristor can adopt when a forward current flows;
 'latching current', 'holding current' and 'recovery time' are characteristic variables of the respective thyristor and are usually indicated in the data sheet thereof.

A thyristor can be brought into the conducting state, which is also termed triggering or switching on, in that a forward voltage is applied and a positive control voltage is applied at least temporarily, typically for approximately 10 µs, and a trigger current generated until the forward current exceeds the latching current. The thyristor now remains in the conducting state even when the control current extinguishes or even is reversed in polarity, but only as long as the forward current does not exceed the holding current and the forward voltage is present. However, as soon as the main voltage is reversed in polarity so that there is a reverse voltage from the forward voltage or the forward current drops below the holding current, the thyristor goes over into the blocking state, which is also called extinguishing or switching off or commutation.

Normal thyristors, which are also termed naturally commutating thyristors, can be extinguished only in the aforedescribed manner, but gate turn-off (GTO) thyristors can additionally also be extinguished by an extinguishing current. Thus, normal thyristors usually extinguish at the earliest when the main current reaches the next zero transition, whereagainst GTO thyristors can be extinguished at any desired instant. Normal thyristors are at present designed for, for example, currents up to 2.2 kA and more and for voltages up to 7 kV and more, whereas GTO thyristors at present can be designed only for lower currents and voltages and are more expensive.

EP 1 160 965 B1 describes a system for an uninterrupted power supply that includes an input, which is connected with an input energy source, and an output, which is connected with a critical load. This system additionally includes a supply isolating switch, which includes two normal thyristors in anti-parallel connection and is coupled between the input and an output bus, a battery bus, an inverter, which is coupled between the battery bus and the output, and an inverter control. In the case of collapse of the input voltage the inverter generates at the input bus a compensating voltage, which is required for the uninterrupted power supply, and manages this compensating voltage in combination with the decaying input voltage for the purpose of automatically commutating the thyristors of the supply isolating switch, since the current is driven by it to zero. If an input energy source fault is ascertained, which causes a rises in the amount of the input voltage, the inverter control controls the inverter in such a way that it generates at the input bus a voltage which has the same polarity as the input voltage and a higher value than the input voltage, whereby the thyristors of the supply isolating switch are constrained to commutate.

EP 1 276 202 B1 describes a system for an uninterrupted power supply and a method for controlling such a system. This system includes an alternating current source for supply of a load, a direct current source, an inverter connected between the direct current source and the load, an alternating current switch, which includes two thyristors in anti-parallel connection and which is connected between the alternating current source and the load or the inverter, a current sensor for the current through the alternating current switch, and a control device. If the supply voltage of the alternating current source fails, the alternating current switch opens and an output voltage that supplies the load is generated the inverter. The control device can, for this purpose, generate a synchronous sinusoidal voltage, a high-synchronous sinusoidal voltage, and a low-synchronous voltage and feed these to the inverter as a reference voltage. The synchronous sinusoidal voltage is synchronised with the alternating current source. The high-synchronous sinusoidal voltage has by comparison with the synchronous sinusoidal voltage the same phase and a greater amplitude. The low-synchronous sinusoidal voltage has, by comparison with the synchronous sinusoidal voltage, the same phase and a smaller amplitude. If the control device does not detect failure of the alternating current source, then it feeds the synchronous sinusoidal voltage to the inverter as reference voltage, whereupon the inverter sets the output voltage in such a way that by comparison with the voltage of the alternating current source it has the same phase and the same amplitude. If the control device detects failure of the alternating current source, then—if the current sensor detects a positive current—it feeds the high-synchronous sinusoidal voltage to the inverter as a reference voltage, whereupon the inverter sets the output voltage in such a way that, by comparison with the voltage of the alternating current source, it has the same phase and a greater amplitude. If the control device detects failure of the alternating current source, then—if the current sensor detects a negative current—it feeds the low/high-synchronous sinusoidal voltage to the inverter as reference voltage, whereupon the inverter sets the output voltage in such a way that, by comparison with the voltage of the alternating current source, it has the same phase and a smaller amplitude. If the control device detects failure of the alternating current source, then—if the current sensor detects a current equal to zero—it feeds the synchronous sinusoidal voltage to the inverter as reference voltage.

SUMMARY

An embodiment of the present invention provides a method for controlling an uninterrupted power supply with a system that has: a first connection terminal, which is connectable to an alternating current source; a second connection terminal, which is connectable to an alternating current load; a switch having: a first switch terminal connected to the first connection terminal; a second switch terminal connected to the second connection terminal; a first thyristor connected between the first switch terminal and the second switch terminal; and a second thyristor connected between the first switch terminal and the second switch terminal in anti-parallel to the first thyristor; an energy store; and an inverter connected to the second connection terminal and the energy store. During the method, the switch current flowing through the switch is detected; a first potential present at the first connection terminal is detected; and in a first fault case, in which an amount of the first potential drops so that an instantaneous value of the first potential infringes a first predetermined permissibility rule and an amount of the switch current rises so that an instantaneous value of the switch current infringes a second predetermined permissibility rule: a second potential present at the second switch terminal is set using the inverter such that the switch current is driven to zero; and after setting the second potential, the switch current is checked in that: the amount of the switch current is detected up to a predetermined first checking time after the setting of the second potential and is compared with a predetermined threshold value, and if this second threshold value is exceeded, a first check result is evaluated as positive, and otherwise as negative; in the case of the positive first check result, the second potential is reversed; in the case of the negative first check result, the switch current is detected at a predetermined second checking time at or after the first checking time and is compared with zero, and if there is a departure from zero, a second check result is evaluated as positive, and otherwise as negative; and in the case of the positive second check result, the second potential is reversed.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 4a and FIG. 4b show a first plot over time of voltages in the system of FIG. 2, wherein the system is controlled in accordance with the preferred form of an embodiment of the method;

DETAILED DESCRIPTION

In the following, an expression of the kind "A is coupled to B" corresponds with an expression of the kind "A is connected with B", an expression of the kind "A is connected with B" has the meanings "A is directly electrically conductively connected with B" and "A is indirectly, thus via C, electrically conductively connected with B" and an expression of the kind "A is attached to B" has the meaning "A is directly electrically conductively connected with B".

According to a first aspect, the invention provides a method of controlling an uninterrupted power supply with the help of a system for the uninterrupted power supply, wherein the system includes:
  a first connection terminal which can be connected with an alternating current source;
  a second connection terminal which can be connected with an alternating current load;
  a switch including:
    a first switch terminal connected with the first connection terminal;
    a second switch terminal connected with the second connection terminal;
    first thyristor connected between the switch terminals; and
    a second thyristor connected between the switch terminals anti-parallel to the first thyristor;
  an energy store; and
  an inverter connected with the second connection terminal and the energy store;
Wherein:
  a switch current flowing through the switch is detected;
  a first potential present at the first connection terminal is detected; and
  in a first fault case in which the amount of the first potential impermissibly drops and the amount of the switch current impermissibly rises:
    a second potential present at the second switch terminal is so set with the help of the inverter that the switch current is driven to zero; and after setting of the second potential the switch current is checked in that:
the amount of the switch current is detected up to a predetermined first checking instant lying after the setting of the second potential and is compared with a predetermined threshold value and if this second threshold value is exceeded a first check result is evaluated as positive and otherwise as negative;
in the case of a positive first check result the second potential is reversed;
in the case of a negative first check result the switch current is detected at a predetermined second checking instant lying at or after the first checking instant and is compared with zero and if there is departure from zero a second check result is evaluated as positive and otherwise as negative; and
in the case of a positive second check result the second potential is reversed.

According to a second aspect, the invention provides a system for uninterrupted power supply, wherein the system includes:
a first connection terminal which can be connected with an alternating current source;
a second connection terminal which can be connected with an alternating current load;
a switch including:
a first switch terminal connected with the first connection terminal;
a second switch terminal connected with the second connection terminal;
first thyristor connected between the switch terminals; and
a second thyristor connected between the switch terminals anti-parallel to the first thyristor;
an energy store;
an inverter connected with the second connection terminal and the energy store;
a current sensor which can detect a switch current flowing through the switch;
a first voltage sensor which can detect a first potential present at the first connection terminal; and
a control device coupled to the switch, the inverter and the sensors;
wherein the control device is constructed in such a way that it:
can evaluate the switch current and the first potential; and
can recognise a first fault case, in which the amount of the first potential impermissibly drops and the amount of the switch current impermissibly rises and in that case it:
controls the inverter in such a way that it generates a second potential which is present at the second switch terminal and drives the switch current to zero; and
after setting of the second potential checks the switch current in that it:
compares the amount of the switch current up to a predetermined first checking instant lying after the setting of the second potential with a predetermined threshold value and if this threshold value is exceeded evaluates a first check result as positive and otherwise as negative;
in the case of a positive first check result reverses the second potential;
in the case of a negative first check result compares the switch current at a predetermined second checking instant lying at or after the first checking instant with zero and if there is departure from zero evaluates a second check result as positive and otherwise as negative; and
in the case of a positive second check result reverses the second potential.

The invention enables rapid extinguishing or switching-off or commutation of the thyristors, and thus, rapid opening of the switch itself for the case that the thyristors are normal thyristors, since the second potential is selected in such a way that the switch current is driven to zero and its value drops to zero. For the case that this value should not, as desired, drop to zero already after application of the second potential the applied second potential is reversed, which has the consequence that the switch current is at the latest thereby driven to zero. Thus, the uninterrupted current supply can be subsequently started as quickly as possible. The mentioned case that the value of the switch current does not drop to zero can occur, for example, if the sign of the switch current due to high delay times or inaccuracy in the measurement is incorrectly determined or changes unexpectedly.

In the context of the invention, the dropping of a magnitude such as, for example, the dropping of the amount of the first potential shall be "impermissible" if the instantaneous value of this magnitude infringes a predetermined permissibility rule, but otherwise shall be "permissible". This permissibility rule can prescribe, for example, that the instantaneous value has to lie above a predetermined threshold value and/or that the time derivative of the instantaneous value has to lie above a predetermined threshold value. In the context of the invention the rise of a magnitude such as, for example, the rise of the amount of the switch current shall be "impermissible" if the instantaneous value of this magnitude infringes a predetermined permissibility rule, but otherwise shall be "permissible". This permissibility rule can prescribe, for example, that the instantaneous value has to lie below a predetermined threshold value and/or that the time derivative of the instantaneous value has to lie below a predetermined threshold value. Each threshold value can be constant or variable according to need.

In the context of the invention checking of the switch current after setting of the second potential shall include comparison of the switch current with a predetermined threshold value and/or checking at a predetermined checking instant whether the switch current differs from zero. If at any instant after setting of the second potential the threshold value is thus exceeded and/or the switch current at the checking instant after setting of the second potential thus differs from zero then the check is to be evaluated as positive.

In the following, the direction from the first to the second connection terminal is termed a system forward direction and the direction from the second to the first connection terminal is termed a system reverse direction.

The system of an embodiment of the method and an embodiment of the system can be constructed in any mode and manner according to requirements and/or, for example, can include no or at least one additional switch and/or no or at least one additional energy store and/or no or at least one additional inverter and/or no or at least one additional current sensor and/or no or at least one additional voltage sensor and/or no or at least one additional control device.

Each switch can be constructed in desired mode and manner according to requirements and/or include, for example, no or at least one additional thyristor.

The thyristors are, for example, connected in such a way that that the forward direction of the first thyristor faces from the first to the second connection terminal or from the first to the second switch terminal and the forward direction of the second thyristor faces from the second to the first connection terminal or from the second to the first switch terminal.

Each thyristor can be constructed in desired mode and manner according to requirements, for example as a normal thyristor or as a GTO thyristor or as an optically triggered thyristor.

Each energy store can be constructed in desired mode and manner according to requirements and/or include, for example, at least one battery and/or at least one capacitor.

The alternating current source is, for example, an alternating current mains. The alternating current load is, for example, an alternating current mains or a factory which produces semiconductors or semiconductor products or glass or glass products or plastic or products of plastic.

It can be specified that
  in the first fault case
    setting of the second potential is carried out in such a way that $\text{sgn}(iS)\cdot v1 \leq \text{sgn}(iS)\cdot v2$, particularly $\text{sgn}(iS)\cdot v1 < \text{sgn}(iS)\cdot v2$, or
    $-v2/v1 \geq 1$, particularly $-v2/v1 > 1$,
and/or
  the control device is so constructed that in the first fault case it
    controls the inverter in such a way that for the second potential $\text{sgn}(iS)\cdot v1 \leq \text{sgn}(iS)\cdot v2$, particularly $\text{sgn}(iS)\cdot v1 < \text{sgn}(iS)\cdot v2$, or
$-v2/v1 \geq 1$, particularly $-v2/v1 > 1$,
wherein v1 is the instantaneous value of the first potential, v2 is the instantaneous value of the second potential and iS is the instantaneous value of the switch current.

It can be specified that
  the reversal is carried out in accordance with the following equation $v2(t2) = -A1 \cdot v2(t1)$ in which $A1 \geq 1$ and $t2 > t1$, wherein v2 is the instantaneous value of the second potential, t2 is an instant lying after the reversal, t1 is an instant lying in front of the reversal and A1 is a first proportioning factor.

For preference A1 is equal to or greater than 1.05 or equal to or greater than 1.1 or equal to or greater than 1.15 or equal to or greater than 1.2 or equal to or greater than 1.25 or equal to or greater than 1.3 or equal to or greater than 1.35.

The predetermined threshold value for the switch current preferably lies in the range of 1.5 to 2 times the rated current of the system. However, depending on component this value can also be other values, such as, for example, the same as or three times or four times the rated current of the system.

It can be specified that
  for the predetermined second check instant
PZ2 = T3 + A2·tq in which $A2 \geq 1$,
  wherein PZ2 is the second checking instant, T3 is the instant at which the second potential was set, A2 is a second proportioning factor and tq is the recovery time of the thyristors (113, 114).

Preferably A2 is equal to or greater than 1.05 or equal to or greater than 1.1 or equal to or greater than 1.15 or equal to or greater than 1.2 or equal to or greater than 1.25 or equal to or greater than 1.3 or equal to or greater than 1.35 or equal to or greater than 2 or equal to or greater than 3 or equal to or greater than 4 or equal to or greater than 5.

It can be specified that
  after the reversal
$v2 = \text{sgn}(iS)\cdot v0$ in which $v0 > 0$,
  wherein v0 is a predetermined default potential, v2 is the instantaneous value of the second potential and iS is the instantaneous value of the switch current.

The default potential is, for example, constant or variable or variable over time. The default potential is preferably selected in such a way that the amount of the switch current drops to zero.

It can be specified that
  the default potential is selected at least for a time in such a way that
$v0 = A3\cdot VWR$ in which $0 < A3 \leq 1$
and/or
  the control device is constructed in such a way that it selects the default potential at least for a time in such a way that
$v0 = A3\cdot VWR$ in which $0 < A3 \leq 1$,
wherein A3 is a third proportioning factor and VWR is the nominal potential of the inverter.

The third proportioning factor is, for example, constant or variable or variable over time or monotonically decreases over time.

For preference A3 is equal to or smaller than 0.95 or equal to or smaller than 0.9 or equal to or smaller than 0.85 or equal to or smaller than 0.8 or equal to or smaller than 0.75 or equal to or smaller than 0.7 or equal to or smaller than 0.65 or equal to or smaller than 0.6 or equal to or smaller than 0.55.

It can be specified that
  the default potential is selected at least for a time in such a way that $v0 = v(iS)$
and/or
  the control device is constructed in such a way that it selects the default potential at least for a time in such a way that
$v0 = v(iS)$,
wherein v(iS) is a function dependent on the switch current.

It can be specified that
  the function is selected in such a way that
$v(iS) = L\cdot d|iS|/dt$
and/or
  the control device is constructed in such a way that it selects the function in such a way that
$v(iS) = L\cdot d|iS|/dt$,
wherein L is the inductivity of the alternating current source and of the section of the system between the first connection terminal and the second switch terminal and $d|iS|/dt$ is the time derivative of the amount of the switch current.

It can be specified that
  the default potential is determined at least for a time by a regulation managed through the switch current
and/or
  the control device is constructed in such a way that it can determine the default potential at least for a time by a regulation managed through the switch current It can be specified that
  monitoring is carried out as to whether the amount of the switch current after the reversal has dropped to zero; as soon as the amount of the switch current has dropped to zero a waiting time is waited out, for which
TW = A4·tq in which $A4 \geq 1$,
  wherein TW is the waiting time, A4 is a fourth proportioning factor and tq is the recovery time of the thyristors; and
  after expiry of the waiting time the second potential is set with the help of the inverter in such a way as is required for an uninterrupted power supply and/or with the help of the inverter an active power such as required for an uninterrupted power supply and/or a reactive power such as required for an uninterrupted power supply is or are generated.

It can be specified that the control device is constructed in such a way that it can monitor and/or recognise whether the amount of the switch current after the reversal has dropped to zero;

as soon as the amount of the switch current has dropped to zero, waits out a waiting time, for which TW=A4·tq in which A4≥1, wherein TW is the waiting time, A4 is a fourth proportioning factor and tq is the recovery time of the thyristors; and after expiry of the waiting time, so controls the inverter that it sets the second potential in such a way as is required for an uninterrupted power supply and/or generates an active power such as required for an uninterrupted power supply and/or a reactive power such as required for an uninterrupted power supply.

This waiting time prevents further firing of the just-extinguished thyristor.

Preferably A4 is equal to or greater than 1.05 or equal to or greater than 1.1 or equal to or greater than 1.15 or equal to or greater than 1.2 or equal to or greater than 1.3 or equal to or greater than 1.4 or equal to or greater than 1.6 or equal to or greater than 1.8 or equal to or greater than 2 or equal to or greater than 2.5 or equal to or greater than 3.

It can be specified that in a second fault case in which the amount of the first potential impermissibly drops and the amount of the switch current drops and/or in a fluctuation case in which the amount of the first potential permissibly rises or permissibly drops then with the help of the inverter the second potential such as required for an uninterrupted power supply is set; and/or an active power such as required for an uninterrupted power supply and/or a reactive power such as required for an uninterrupted power supply is or are generated.

It can be specified that the control device is constructed in such a way that it can recognise a second fault case in which the amount of the first potential impermissibly drops and the amount of the switch current drops and/or can recognise a fluctuation case in which the amount of the first potential permissibly rises or permissibly drops and in each of these cases controls the inverter in such a way that it sets the second potential such as required for an uninterrupted power supply; and/or generates an active power such as required for an uninterrupted power supply and/or a reactive power such as required for an uninterrupted power supply.

It can be specified that in the first and/or second fault case no trigger current is supplied to the thyristors and/or the control device is constructed in such a way that in the first and/or second fault case it does not supply any trigger current to the thyristors.

It can be specified that the second potential is detected; and the inverter is regulated and/or controlled with the help of the second potential and/or in dependence on the second potential.

It can be specified that the system includes a second voltage sensor which can detect the second potential and is coupled to the control device; and the control device is constructed in such a way that it regulates and/or controls the inverter with the help of the second potential and/or in dependence on the second potential.

It can be specified that the inverter is of bidirectional configuration; or a rectifier is connected in parallel with the inverter and, in particular, is coupled to the control device.

The energy store can be charged by an inverter of that kind or by that rectifier.

It can be specified that the system includes at least one coil connected between the first connection terminal and the first switch terminal or between the second switch terminal and the second connection terminal; and/or at least one capacitor connected between the first connection terminal and ground or between the first switch terminal and ground or between the second switch terminal and ground or between the second connection terminal and ground; and/or at least one transformer connected between the inverter and the second switch terminal or between the inverter and the second connection terminal.

For preference the reactance and/or impedance of the coil is or are so selected that it or they correspond or respectively correspond with the maximum possible reactance and/or impedance of the alternating current source.

It can be specified that each of the proposed systems is constructed in such a way and/or serves such a purpose and/or is suitable for such a purpose that it performs and/or can perform one of the proposed methods; and/or the system forms one of the proposed methods.

By way of example, one of the proposed methods can be performed by any of the proposed systems.

The statements and explanations with respect to any one of the aspects of the invention, particularly to individual features of that aspect, also correspondingly apply in analogous manner to the other aspects of the invention.

Forms of embodiments of the invention are explained in more detail in the following by way of example with reference to the accompanying drawings. However, the individual features evident therefrom are not confined to the individual forms of embodiment, but can be connected and/or combined with further above-described individual features and/or with individual features of other forms of embodiment. The details in the drawings are only explanatory and are not to be understood as limiting. The reference numerals present in the claims are not to restrict the scope of protection of the invention in any way, but refer merely to the forms of embodiment shown in the drawings.

Figure 1:
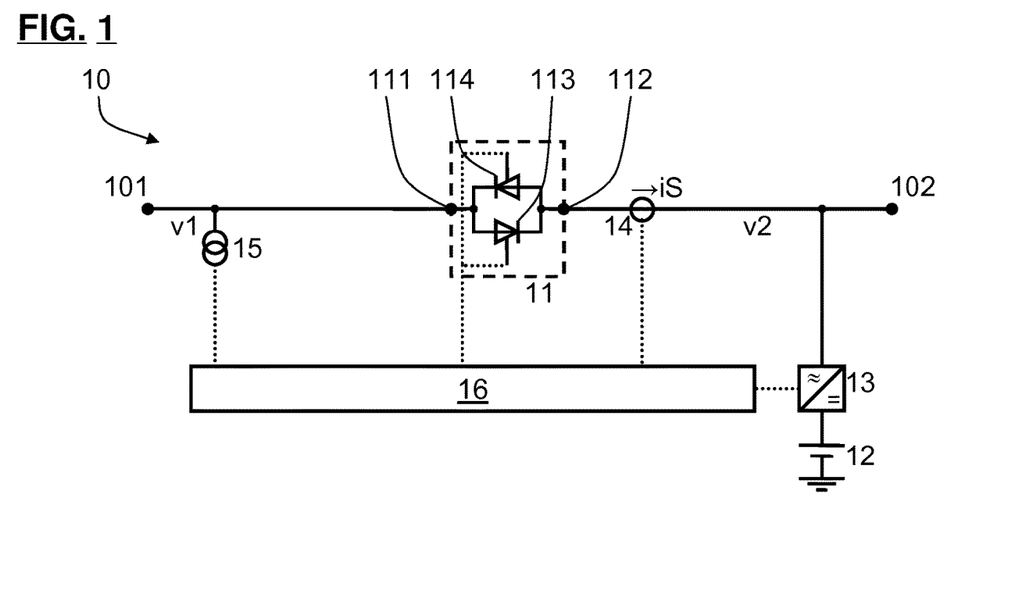
FIG. 1 shows a first embodiment of a system for uninterrupted power supply.

A first form of embodiment of an electrical installation 10 for an uninterrupted power supply is schematically illustrated in FIG. 1. The system 10 includes a first connection terminal 101, which can be connected with an alternating current source, and a second connection terminal 102, which can be connected with an alternating current consumer or with a load. The system 10 includes a switch 11 with a first switch terminal 111, a second switch terminal 112, a first thyristor 113, a second thyristor 114, an energy store 12, an inverter 13 with a nominal potential, a current sensor 14, a first voltage sensor 15 and a control device 16, which is coupled to the switch 11, the inverter 13 and the sensors 14 and 15.

The first switch terminal 111 is connected with the first connection terminal 101 and the second switch terminal 112 is connected with the second connection terminal 102. The first thyristor 113 is connected between the switch terminals 111 and 112 and the second thyristor 114 is connected between the switch terminals 111 and 112 anti-parallel to the first thyristor 113.

The inverter 13 is connected by its alternating voltage output with the second connection terminal 102 and the second switch terminal 112 is connected by its direct voltage input with the energy store 12. It is thus connected between the second connection terminal 102 and the energy store 12 and equally between the second switch terminal 112 and the energy store 12.

By way of example, the current sensor 14 is coupled to the second switch terminal 112 and can thus detect current that flows through the switch 11, and is also termed switch current. However, it can also be coupled to the first switch terminal 111. The switch current is positive when it flows from the first switch terminal 111 to the second switch terminal 112, thus in the system forward direction.

The first voltage sensor 15 is coupled to the first connection terminal 101 and can thus detect the potential which is present at the first connection terminal 101, and which is also termed first potential.

In this form of embodiment, the thyristors 113 and 114 are constructed as, for example, normal thyristors and not as GTO thyristors and are connected in such a way that the forward direction of the first thyristor 113 faces from the first switch terminal 111 to the second switch terminal 112, and thus, from the first connection terminal 101 to the second connection terminal 102, and the forward direction of the second thyristor 114 faces from the second switch terminal 114 to the first switch terminal 113, and thus, from the second connection terminal 102 to the first connection terminal 101.

In this form of embodiment, the control device 16 is constructed in accordance with a first form of embodiment and, in particular, in such a way that it:
  can evaluate the switch current and the first potential; and
  can recognise a first fault case in which the amount of the first potential impermissibly drops and the amount of the switch current impermissibly rises, and in this case it
    controls the inverter 13 in such a way that it generates a second potential which is present at the second switch terminal 102 and thus also at the second connection terminal 112 and drives the switch current to zero;
    checks the switch current after the setting of the second potential in that it
      compares the amount of the switch current up to a predetermined first checking instant lying after the setting of the second potential with a predetermined threshold value and in the case of exceeding of this threshold value evaluates a first check result as positive and otherwise as negative;
      in the case of a positive first check result reverses the second potential;
      in the case of a negative first check result compares the switch current at a predetermined second checking instant lying at or after the first checking instant with zero and in the case of departure from zero evaluates the second check result as positive and otherwise as negative; and
      in the case of a positive second check result reverses the second potential.

The first fault case means that the supply voltage delivered by the alternating current source is interrupted at least temporarily or even fails and can occur, for example, when at the switch 11 the switch current lags behind the first potential, because if, for example, the second thyristor 114 conducts the negative switch current—thus switch current flowing in reverse direction—and at the first connection terminal 101 the first potential is already positive due to the phase displacement and in this situation the supply voltage is interrupted, then due to the regulating intervention of the inverter 13, which generates at the second connection terminal 102 the positive second potential required for the uninterrupted power supply, an undesired negative—thus facing in reverse direction—voltage across the switch 11 arises. This negative voltage represents for the second thyristor 114 a forward voltage and drives up the negative switch current via the second thyristor 114, so that this cannot extinguish due to the switch current becoming zero. There is a risk that the inverter 13 and/or the second thyristor 114 is or are destroyed and that the power supplied by the inverter 13 for the uninterrupted power supply does not pass in sufficient measure to the alternating current load, since an excessive proportion is absorbed by the alternating current source.

The control device 16 now intervenes here in that it controls the inverter 13 so that this departs from its normal regulating intervention for the uninterrupted current supply and generates at the second connection terminal 102 a potential, thus the second potential, which provides compensation or even over-compensation for this negative voltage and thus the forward voltage of the second thyristor 114.

The second potential has to be sufficiently high for that purpose and counteract the negative switch current, which can be expressed by the foregoing equation. Since, as mentioned above, the default potential is equal to the nominal potential of the inverter 13 the second potential is thus set in this described example of the inverter 13 to a value equal to the negative nominal potential.

Consequently, the control device 16 is constructed in such a way that it:
  controls the inverter 13 in such a way that it generates the second potential so that
    sgn(iS)·v1<sgn(iS)·v2 or −v2/v1>1,
    wherein v1 is the instantaneous value of the first potential, v2 is the instantaneous value of the second potential and iS is the instantaneous value of the switch current.

However, it can happen that the second potential to be applied is erroneously determined, ascertained or calculated. An erroneous determination is present, for example, if at the instant of detection of the switch current the sign of the switch current is negative, but the switch current up to generation of the second potential by means of the inverter 13 changes its sign. This can happen, for example, in the case of a rapid change of the switch current.

A further reason for erroneous determination of the second potential can be, for example, a high delay time or inaccuracy in the detection or measurement of the switch current. If, for example, two measurement instants at which the switch current is detected are too far apart then a change of the sign of the switch current is possible without this change of sign being detected in good time by the control device 16.

In this case, there is exactly the converse effect of the above-mentioned regulating intervention for compensation for the negative voltage, because due to the fact that the sign on the switch current changes prior to generation of the second potential at the second switch terminal 102 a positive switch current, for example, now flows through the first thyristor 113. If the second potential set in the meantime is now generated at the second switch terminal 102 at an instant t1 there arises between the first and second switch terminals 101 and 102 a positive voltage which represents a forward voltage for the first thyristor 113 and drives the positive switch current through the first thyristor 113, so that this cannot extinguish due to the switch current becoming zero. There is again the risk that the inverter 13 and/or the thyristor 113 is or are destroyed and the power supplied by the inverter 13 for the uninterrupted voltage supply does not pass in sufficient measure to the alternating current load.

The control device 16 now intervenes here a second time in that it reverses the second potential and thus produces a correct potential at the second switch terminal 102, which leads to extinguishing of the now-conducting first thyristor 113 and thus to separation of the alternating current load and the inverter 13 from the mains supply. Trigger for the second control action is monitoring of the switch current after generation of the second potential. If the amount of the switch current at an instant t2 lying after generation of the second potential exceeds a defined threshold value, which here is also termed second threshold value SW2, or if this amount at a predetermined checking instant after generation of the second potential has not dropped to zero then the previous potential is reversed. This has the consequence that in the described case there is now present between the first and second switch terminals 101 and 102 a negative voltage which represents a reverse voltage for the first thyristor 113 and drives the switch current through the first thyristor 113 to zero, so that this extinguishes due to the switch current becoming zero.

This system 10 thus leads to a preferred form of embodiment of a method for controlling an uninterrupted power supply, which includes the previously described steps and features.

Figure 2:
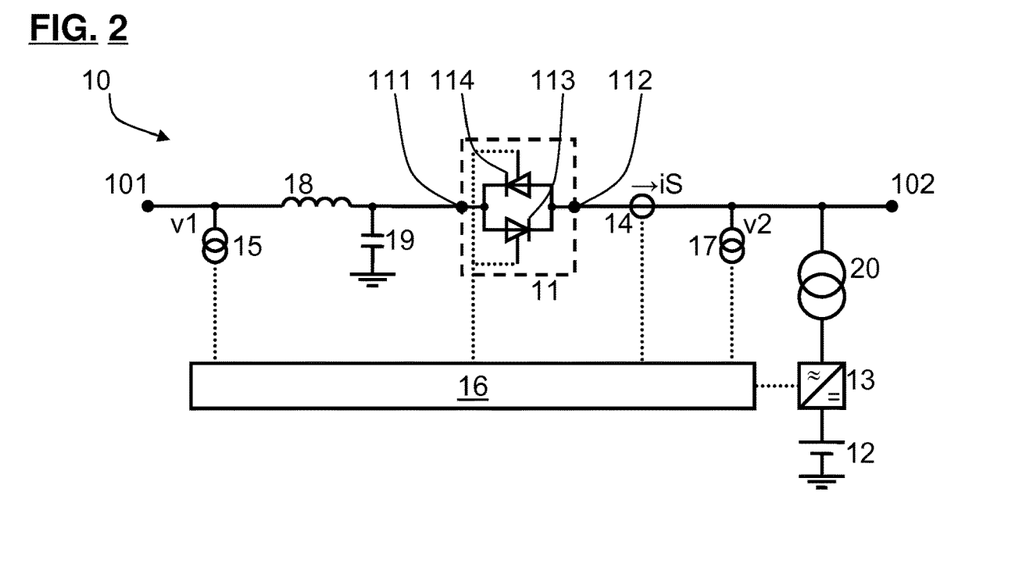
FIG. 2 shows a second embodiment of a system for uninterrupted power supply.

A second form of embodiment of the system 10 is schematically illustrated in FIG. 2. This form of embodiment is similar to the first form of embodiment, so that in the following primarily the differences are explained in more detail.

In this form of embodiment the system 10 includes, for example, a second voltage sensor 17, a coil 18, a capacitor 19 and a transformer 20.

The second voltage sensor 17 is coupled to the control device 16 and to the second connection terminal 102 and can thus detect the second potential present at the second connection terminal 102. The control device 16 regulates the inverter 13 with the help of the second voltage sensor 17.

The coil 18 is connected between the first connection terminal 101 and the first switch terminal 112. The reactance and inductivity thereof are so selected, for example, that they correspond with the reactance and inductivity of the alternating current source. If the alternating current source is, for example, an alternating current mains then the reactance thereof is typically substantially an inductance which depends on its inductivity, which in turn increases with the length of the lines of the alternating current mains. The capacitor 19 is connected between the first switch terminal 112 and ground. However, by way of example, it is also possible for the coil 18 to be eliminated or arranged on the other side of the switch 11 and/or for the capacitor 19 to be eliminated or arranged on the other side of the switch 11.

The transformer 20 is connected between the inverter 13 and the second switch terminal 112 and thus also between the inverter 13 and the second connection terminal 102. It serves the purpose of increasing the alternating voltage supplied by the inverter 13.

The inverter 13 is, for example, of bidirectional construction, thus not only can convert the direct voltage supplied by the energy store 12 into an alternating voltage at the second switch terminal 112 and the second connection terminal 102, but also can convert an alternating voltage present at the second switch terminal 112 and the second connection terminal 102 into a direct voltage for charging the energy store 12. Consequently, its alternating voltage output also forms an alternating voltage input and its direct voltage input also forms a direct voltage output. However, by way of example it is also possible that the inverter 13 is not bidirectional and instead thereof a rectifier (not illustrated) is connected in parallel with the inverter 13 and coupled to the control device 16.

In this form of embodiment the control device 16 is constructed in accordance with a second form of embodiment which is similar to the first form of embodiment, so that primarily the differences are explained in more detail in the following.

In this form of embodiment, the control device 16 is constructed in such a way that it:
  can recognise a second fault case in which the amount of the first potential impermissibly drops and the amount of the switch current drops and can recognise a fluctuation case in which the amount of the first potential permissibly rises or permissibly drops and in each of these cases controls the inverter 13 in such a way that it
  sets the second potential in such a way as is required for an uninterrupted voltage supply and generates it at the second connection terminal 102;
  in the first and second fault case does not feed to the thyristors 113 and 114 any trigger current.

This second fault case means like the first fault case that the supply voltage supplied by the alternating current source is at least temporarily interrupted or even disappears and can arise, for example, if at the switch 11 the current leads the first potential or is in phase therewith, because if, for example, the first thyristor 113 conducts the positive switch current—thus switch current flowing in its forward direction—and at the first connection terminal 101 the first potential is already positive due to the phase displacement and in this situation the supply voltage is interrupted then due to the regulating intervention of the inverter 13, which generates at the second connection terminal 102 the positive second potential required for the uninterrupted power supply, a desired negative voltage—thus voltage facing in system reverse direction—across the switch 11 arises. This negative voltage drives the positive switch current through the first thyristor 113 to zero so that this is extinguished due to the switch current becoming zero. There is therefore no risk that that the inverter 13 and/or the first thyristor 113 is or are destroyed and that the power supplied by the inverter 13 for the uninterrupted power supply does not pass in sufficient measure to the alternating current load. The control device 16 does not have to intervene here and the inverter 13 can look after uninterrupted power supply.

In this form of embodiment the control device 16 is constructed in such a way that it
  can monitor whether after the reversal the amount of the switch current has dropped to zero or the switch current reached zero;

as soon as the amount of the switch current has dropped to zero or the switch current has reached zero waits out a waiting time, for which TW=A4·tq in which A4≥1, wherein TW is the waiting time, A4 is a fourth proportioning factor and tq is the recovery time of the thyristors 113 and 114; and after expiry of the waiting time controls the inverter 13 in such a way that it sets the second potential such as is required for an uninterrupted power supply.

In this form of embodiment the control device 16 is constructed in such a way that it selects the default potential in such a way that v0=A3·VWR in which A3≤1, wherein A3 is a third proportioning factor, which by way of example is here equal to 0.5, and VWR is the nominal potential of the inverter 13.

Alternatively or additionally the control device 16 can be constructed in such a way that it selects the default potential at least temporarily in such a way that v0=v(iS)=L·d|iS|/dt, wherein L is the inductivity of the alternating current source and of the section of the system 10 between the first connection terminal 101 and the second switch terminal 112 and d|iS|/dt is the time derivative of the amount of the switch current.

In this form of embodiment L is thus substantially the sum of the inductivity of the alternating current source and the inductivity of the coil 18.

Alternatively or additionally the control device 16 can be constructed in such a way that it determines the default potential at least for a time by a regulation conducted via the switch current and, in particular, reduces the default potential to the extent to which the amount of the switch current drops.

Figure 3A:
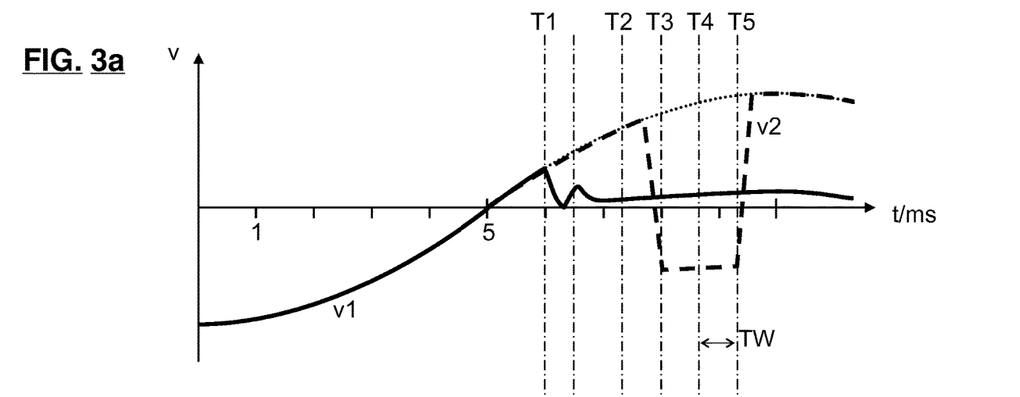
FIG. 3a shows a plot over time of potentials in the system of FIG. 2, wherein the system is controlled in accordance with a preferred form of an embodiment of a method for controlling an uninterrupted power supply.
Figure 3B:
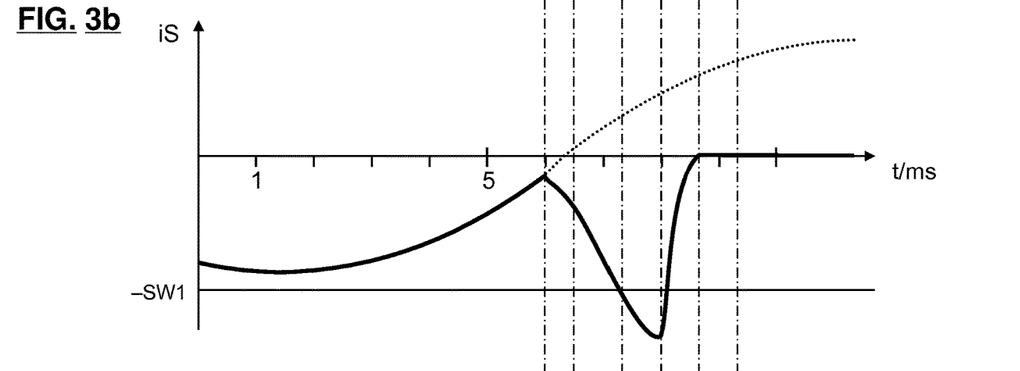
FIG. 3b shows a plot over time, which is synchronised with FIG. 3a, of the current through the switch of the system for the case that the current lags behind the potential.

The plot over time of the first and second potentials in the system of FIG. 2 when the first fault case occurs is illustrated in FIG. 3a. The first potential is illustrated by a continuous line and the second potential by a dashed line. The mains frequency is, for example, 50 Hz. The plot over time, which is synchronised with FIG. 3a, of the switch current, which by way of example lags behind the first potential by 1.3 ms, is illustrated in FIG. 3b. The dotted line in each instance shows the target plot of the potential or the switch current.

A fault occurs in the alternating current mains at an instant T1, which fault causes collapse of the first potential, for example 1 ms after a positive zero transition. At this instant T1 the switch current is still negative, the second thyristor 114 conducts and the first thyristor 113 blocks. The inverter 13 in accordance with its normal regulating intervention required for uninterrupted voltage supply initially sets the second potential to the positive value of the dotted target plot. As a result, a forward voltage driving the switch current in system reverse direction is now present across the conducting second thyristor 114.

The control device 16 recognises at an instant T2 that the amount of the first potential has impermissibly dropped, since it has fallen below a predetermined threshold value, and that the amount of the switch current has impermissibly risen, since it has exceeded a predetermined first threshold value SW1. On the one hand, it therefore does not conduct any trigger voltage to the thyristors 113 and 114. On the other hand, it controls the inverter 13 in such a way that it sets the second potential to v2=−0.5·VWR. Generation of the second potential takes place, as a consequence of the reaction time needed by the control device 16 and the inverter 13 for the calculating and setting, at an instant T3. As a result, the voltage across the switch 11 is reversed in polarity and now faces in system forward direction, so that it drives the switch current to zero and its amount begins to drop. The control device 16 now monitors whether this amount has dropped to zero or the switch current has reached zero.

The control device 16 recognises at an instant T4 that the amount of the switch current has dropped to zero or the switch current has reached zero. It therefore waits out the waiting time so that the just-extinguished second thyristor 114 can regenerate and attain its full blocking capability. The recovery time of the thyristors 113 and 114 is here, by way of example, tq=330 μs, and here, by way of example, TW=670 μs is selected for the waiting time.

The waiting time has expired at an instant T5 and the two non-controlled thyristors 113 and 114 securely block and prevent an undesired flow of power back into the alternating current mains. The control device 16 therefore controls the inverter 13 in such a way that it sets the second potential such as is required for an uninterrupted power supply, thus sets it to the target plot.

The spacing between the instants T1 and T2 is here, for example, 1.33 ms, but can also be significantly lower and, for example, lie below 0.3 ms.

The spacing between the instants T3 and T4 is here, by way of example, 0.67 ms, but can also be significantly lower and, for example, lie below 0.3 ms; this can be achieved by, for example, increasing the default potential and/or by reversing the polarity of the voltage across the switch 11 earlier, thus at a lower value of the switch current.

Figure 3C:
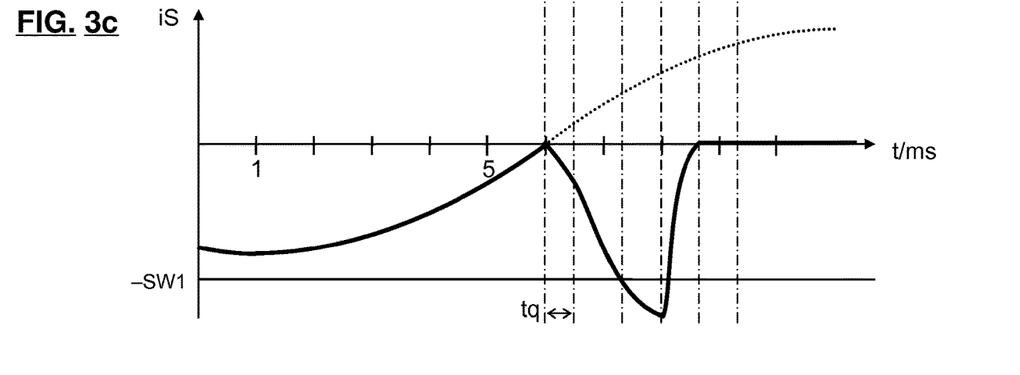
FIG. 3c shows a plot over time, which is synchronised with FIG. 3a, of the current for the case that the current lags behind the potential to a lesser extent.

FIG. 3c is similar to FIG. 3, but the switch current lags behind the first potential to a lesser extent, namely by, for example, 1 ms. At the instant T1 the switch current is therefore no longer negative, but is at its positive zero transition. The previously conducting second thyristor 114 thus does indeed extinguish, but fires again, since a forward voltage driving the switch current in system reverse direction, thus in its forward direction, is present across it within its recovery time.

This equally takes place if the switch current should lag behind the first potential still less or even not at all or even lead it and if a forward voltage should be present, after its positive zero transition, within the recovery time across the second thyristor 114.

Figure 4A:
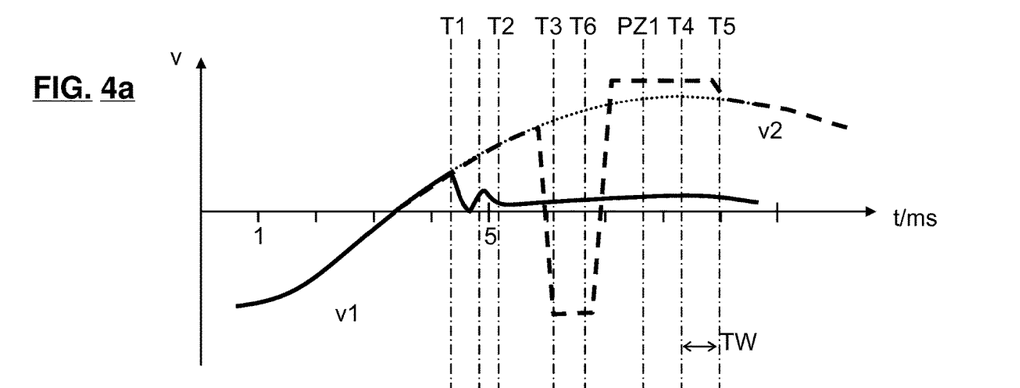
Figure 4B:
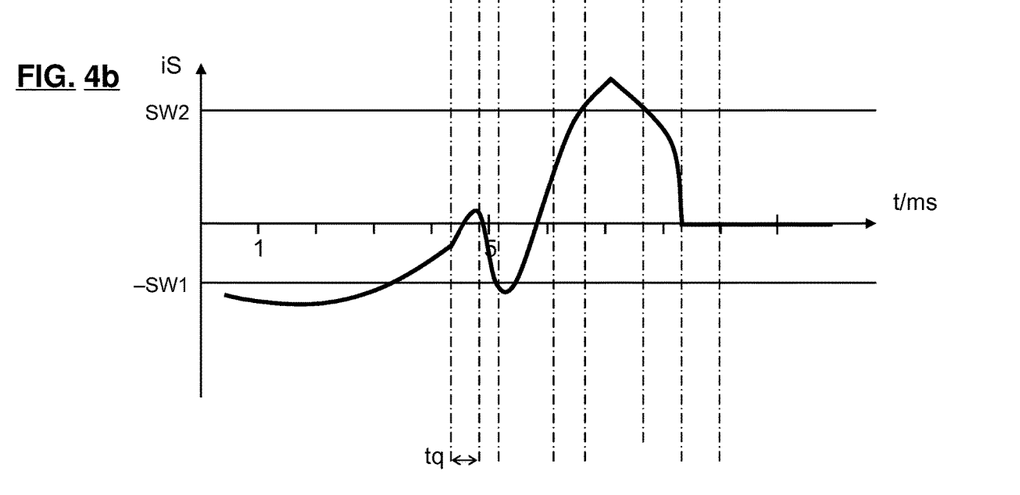
FIG. 4b shows a plot over time, which is synchronised with FIG. 4a, of the current.

FIG. 4 shows the effects of an erroneous determination of the second potential to be applied. The plot over time of the first and second potentials in the system of FIG. 2 is illustrated in FIG. 4a. The plot over time, which is synchronised with FIG. 4a, of the switch current is illustrated in FIG. 4b.

The case illustrated in FIG. 4 is similar to that of FIG. 3, so that primarily the differences are explained in more detail in the following. In FIG. 4b it is illustrated that due to compensating and overshoot effects between the instants T1 and T2 the still-negative switch current temporarily changes its sign and thus the first thyristor 113, which is still blocking at the instant T1, but which is already activated, fires and is briefly conductive. Thereafter, but still before the instant T2, the switch current once again changes its sign and is negative again. Moreover, the switch current in this case again changes its sign between the instant T2, at which the first fault case is recognised, and the instant T3, at which the second potential is set to the desired value by means of the inverter 13 and is applied to the second connection terminal 102, and is positive. This has the consequence that due to the applied negative second potential and the first potential, which lies close to zero, a positive voltage, thus a voltage facing in system forward direction, is indeed applied by way of the switch 11, but unlike the case described in FIG. 3 does not drive the switch current to zero; on the contrary, it drives the switch current, which in this case is indeed now positive, as a result of which it rises further.

At an instant T6, which lies in front of or at a first predetermined checking instant PZ1, the control device 16 recognises that the amount of the switch current has exceeded a predetermined second threshold value SW2 and intervenes once more. This intervention takes place in such a way that the applied second potential is reversed and thus set to v2=+0.5·VWR. As a result, the voltage across the switch 11 is reversed in polarity and now faces in system reverse direction, so that it drives the switch current to zero and its value begins to drop. The control device 16 now monitors whether this amount has dropped to zero or the switch current has reached zero.

In this form of embodiment the control device 16 is constructed in such a way that after the reversal v2=sgn(iS)·v0 in which v0>0, wherein v0=A3·VWR=0.5·VWR.

The control device 16 recognises at the instant T4 that the amount of the switch current has dropped to zero or the switch current has reached zero. It waits out the waiting time so that the first thyristor 113 can regenerate and achieve its full blocking capability.

The waiting time has expired at the instant T5 and the two thyristors 113 and 114 securely block and prevent an undesired power flow back into the alternating current mains. The control device 16 therefore controls the inverter 13 so—that it sets the second potential in such a way as is required for an uninterrupted power supply, thus to the target plot.

The spacing between the instants T6 and T4 is here, by way of example, 1.5 ms, but can also be significantly lower or higher and, for example, lie below 0.3 ms; this can be achieved, for example, by increasing the default potential and/or reducing the inductivity of the coil 18 and/or by increasing the capacitance of the capacitor 19.

Figure 5A:
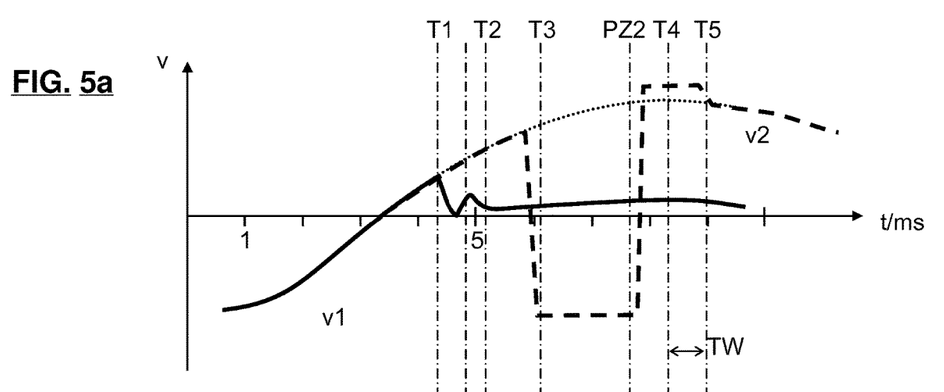
FIG. 5a shows a second plot over time of voltages in the system of FIG. 2, wherein the system is controlled in accordance with the preferred form of an embodiment of the method.
Figure 5B:
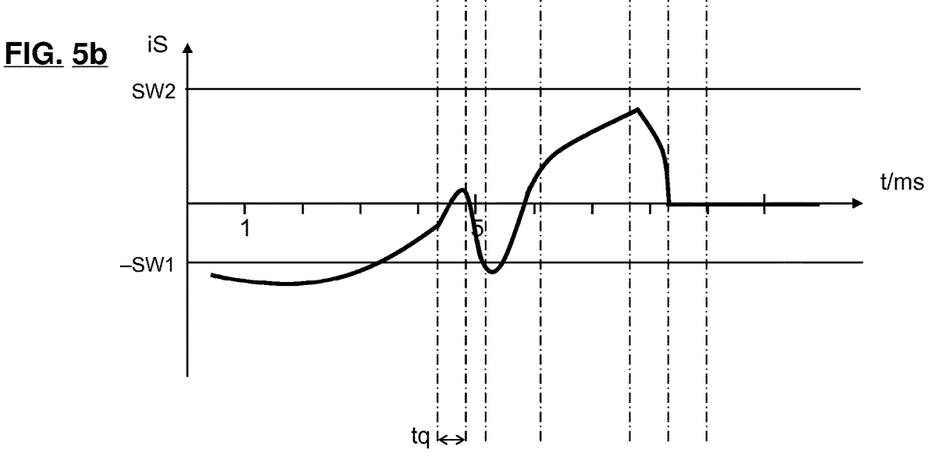
FIG. 5b shows a plot over time, which is synchronised with FIG. 5a, of the current.

FIG. 5 shows the effects of an erroneous determination of the second potential to be applied in the case of a different behaviour of the switch current. The plot over time of the first and second potentials in the system of FIG. 2 is illustrated in FIG. 5a. The plot over time, which is synchronised with FIG. 5a, of the switch current is illustrated in FIG. 5b.

The case illustrated in FIG. 5 is similar to that of FIG. 4, so that in the following primarily the differences are explained in more detail. By contrast to FIG. 4b, in this case the amount of the switch current does not exceed the second threshold value SW2 after generation of the second potential has taken place at the instant T3. In order to nevertheless be able to reliably recognise erroneous setting of the second potential, the control device 16 checks at the predetermined second checking instant PZ2, which in this form of embodiment lies at the first checking instant PZ1 or is the same as the first checking instant PZ1, whether in accordance with expectations the amount of the switch current has fallen to zero or the switch current has reached zero. If this is not the case, then the control device 16 intervenes once more and reverses the second potential, analogously to the procedure according to FIG. 4, to v2=+0.5·VWR. As a result, the voltage across the switch 11 is again changed in polarity so that it drives the switch current to zero and its amount begins to drop. The control device 16 now monitors whether this amount has dropped to zero or the switch current has reached zero.

The control device 16 recognises at the instant T5 that the amount of the switch current has dropped to zero or the switch current has reached zero. It therefore then again waits out the waiting time so that the first thyristor 113 can regenerate and achieve its full blocking capability.

The waiting time has expired at the instant T6 and the two thyristors 113 and 114 reliably block and prevent an undesired flow of power back into the alternating current mains. The control device 16 therefore controls the inverter 13 in such a way that it sets the second potential such as is required for an uninterrupted power supply, thus to the target plot.

The spacing between the instants PZ2 and T4 is here, for example, 0.67 ms, but can also be significantly lower or higher and, for example, lie below 0.3 ms; this can be achieved, for example, by increasing the default potential or reducing the inductivity of the coil 18 and/or by increasing the capacitance of the capacitor 19.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The following are reference numerals used herein:

10 system for uninterrupted power supply
101/102 first/second connection terminal of 10
11 switch
111/112 first/second switch terminal of 11
113/114 first/second thyristor of 11
12 energy store
13 inverter
14 current sensor
15 first voltage sensor
16 control device
17 second voltage sensor
18 coil 19 capacitor
20 transformer
A1/A2/A3/A4 first/second/third/fourth proportioning factor
iS current through 11, switch current
PZ1 first checking instant, up to which 16 compares iS with SW2
PZ2 second checking instant, at which 16 compares iS with zero
SW1/SW2 first/second threshold value
tq recovery time of 113, 114
TW waiting time
T1 instant at which a fault occurs in the alternating current mains
T2 instant at which 16 recognises that |v1| has impermissibly dropped and |iS| has exceeded SW1
T3 instant at which 13 has set v2
T4 instant at which 16 recognises that |iS| has dropped to zero
T5 instant at which TW has expired and 13 sets v2 such as is required for an uninterrupted current supply
T6 instant at which 16 recognises that |iS| has exceeded SW2
v0 default potential
v1 potential at 101/111, first potential
v2 potential at 102/112, second potential
VWR nominal potential of 13

The invention claimed is:

1. A method of controlling an uninterrupted power supply with a system, wherein the system comprises:
   a first connection terminal, which is connectable to an alternating current source;
   a second connection terminal, which is connectable to an alternating current load;
   a switch comprising:
     a first switch terminal connected to the first connection terminal;
     a second switch terminal connected to the second connection terminal;
     a first thyristor connected between the first switch terminal and the second switch terminal; and
     a second thyristor connected between the first switch terminal and the second switch terminal in anti-parallel to the first thyristor;
   an energy store; and
     an inverter connected to the second connection terminal and the energy store, and
   wherein:
     a switch current flowing through the switch is detected;
     a first potential present at the first connection terminal is detected; and
     in a first fault case, in which an amount of the first potential drops so that an instantaneous value of the first potential infringes a first predetermined permissibility rule and an amount of the switch current rises so that an instantaneous value of the switch current infringes a second predetermined permissibility rule:
       a second potential present at the second switch terminal is set using the inverter such that the switch current is driven to zero; and
       after setting the second potential, the switch current is checked in that:
         the amount of the switch current is detected up to a predetermined first checking time after the setting of the second potential and is compared with a predetermined threshold value, and if this second threshold value is exceeded, a first check result is evaluated as positive, and otherwise as negative;
       in the case of the positive first check result, the second potential is reversed;
       in the case of the negative first check result, the switch current is detected at a predetermined second checking time at or after the first checking time and is compared with zero, and if there is a departure from zero, a second check result is evaluated as positive, and otherwise as negative; and
       in the case of the positive second check result, the second potential is reversed.

2. The method according to claim 1,
wherein, in the first fault case, the second potential is set such that:
sgn(iS)·v1≤sgn(iS)·v2, or
sgn(iS)·v1<sgn(iS)·v2, or
−v2/v1≥1 or −v2/v1>1, and
wherein v1 is the instantaneous value of the first potential, v2 is the instantaneous value of the second potential, and iS is the instantaneous value of the switch current.

3. The method according to claim 1,
wherein the reversal is carried out in accordance with the following equation:

$$v2(t2) = -A1 \cdot v2(t1),$$

wherein A1≥1 and t2>t1, and
wherein v2 is the instantaneous value of the second potential, t2 is a time after the reversal, t1 is a time before the reversal, and A1 is a first proportioning factor.

4. The method according to claim 1,
wherein for the predetermined second check time:
PZ2=T3+A2·tq in which A2≥1,
wherein PZ2 is the second checking time, T3 is a time at which the second potential was set, A2 is a second proportioning factor, and tq is a recovery time of the thyristors.

5. The method according to claim 1,
wherein after the reversal:
v2=sgn(iS)·v0 in which v0>0, and
wherein v0 is a predetermined default potential, v2 is the instantaneous value of the second potential, and iS is the instantaneous value of the switch current.

6. The method according to claim 5,
wherein the predetermined default potential is selected, at least for a time, such that:
v0=A3·VWR,
wherein 0<A3≤1, and
wherein A3 is a third proportioning factor, and VWR is a nominal potential of the inverter.

7. The method according to claim 5,
wherein the default predetermined potential is selected, at least for a time, such that:
v0=v(iS), and
wherein v(iS) is a function dependent on the switch current.

8. The method according to claim 7,
wherein the function corresponds to:
v(iS)=L·d|iS|/dt, and
wherein L is an inductivity of the alternating current source and of a section of the system between the first connection terminal and the second switch terminal, and d|iS|/dt is a time derivative of the amount of the switch current.

9. The method according to claim 5, wherein the default predetermined potential is determined, at least for a time, by a regulation managed through the switch current.

10. The method according to claim 1,
wherein monitoring is carried out as to whether the amount of the switch current after the reversal has dropped to zero,
wherein as soon as the amount of the switch current has dropped to zero a waiting time is waited out, for which:
TW=A4·tq,
wherein A4≥1,
wherein TW is the waiting time, A4 is a fourth proportioning factor, and tq is a recovery time of the thyristors, and
wherein after expiry of the waiting time, the second potential is set by using the inverter in such a way as is required for an uninterrupted power supply and/or with the help of the inverter an active power such as required for an uninterrupted power supply and/or a reactive power such as required for an uninterrupted power supply is or are generated.

11. The method according to claim 1, wherein:
in a second fault case in which the amount of the first potential drops and infringes a first predetermined permissibility rule and the amount of the switch current drops, and/or
in a fluctuation case in which the amount of the first potential rises so that the instantaneous value of the first potential does not infringe a predetermined third permissibility rule or drops so that the instantaneous value of the first potential does not infringe the predetermined first permissibility rule:
then, using the inverter, the second potential such as required for an uninterrupted power supply is set; and/or an active power such as required for an uninterrupted power supply and/or a reactive power such as required for an uninterrupted power supply is or are generated.

12. The method according to claim 1,
wherein the second potential is detected; and
wherein the inverter is controlled using the second potential and/or in dependence on the second potential.

13. A system for uninterrupted power supply, the system comprising:
a first connection terminal which is connectable to an alternating current source;
a second connection terminal which is connectable to an alternating current load;
a switch comprising:
a first switch terminal connected to the first connection terminal;
a second switch terminal connected to the second connection terminal;
first thyristor connected between the first switch terminal and the second switch terminal; and
a second thyristor connected between the first switch terminal and the second switch terminal in anti-parallel to the first thyristor;
an energy store;
an inverter connected to the second connection terminal and the energy store;
a current sensor configured to detect a switch current flowing through the switch;
a first voltage sensor configured to detect a first potential present at the first connection terminal; and
a control device coupled to the switch, the inverter, the current sensor, and the first voltage sensor;
wherein the control device is configured to:
evaluate the switch current and the first potential; and
recognise a first fault case, in which an amount of the first potential drops so that an instantaneous value of the first potential infringes a first predetermined permissibility rule and an amount of the switch current rises so that an instantaneous value of the switch current infringes a second predetermined permissibility rule, and the control device is configured such that in the first fault case:
the control device controls the inverter such that the inverter generates a second potential which is present at the second switch terminal and drives the switch current to zero; and
the control device, after setting the second potential, checks the switch current by comparing the amount of the switch current up to a predetermined first checking time after the setting of the second potential with a predetermined threshold value, and if the predetermined threshold value is exceeded, the control device evaluates a first check result as positive, and otherwise as negative;
in the case of the positive first check result, the control device reverses the second potential;
in the case of the negative first check result, the control device compares the switch current at a predetermined second checking time at or after the first checking time with zero, and if there is departure from zero, the control device evaluates a second check result as positive and otherwise as negative; and
in the case of the positive second check result, the control device reverses the second potential.

14. The system according to claim 13,
wherein the control device is configured such that in the first fault case it controls the inverter in such a way that for the second potential:
sgn(iS)·v1≤sgn(iS)·v2, or
sgn(iS)·v1<sgn(iS)·v2, or
v2/v1≥1, or
−v2/v1>1, and
wherein v1 is the instantaneous value of the first potential, v2 is the instantaneous value of the second potential, and iS is the instantaneous value of the switch current.

15. The system according to claim 13 comprising:
a coil connected between the first connection terminal and the first switch terminal or between the second switch terminal and the second connection terminal; and/or
a capacitor connected between the first connection terminal and ground or between the first switch terminal and ground or between the second switch terminal and ground or between the second connection terminal and ground; and/or
a transformer connected between the inverter and the second switch terminal or between the inverter and the second connection terminal.

* * * * *